US006940096B2

(12) United States Patent
Ravi

(10) Patent No.: US 6,940,096 B2
(45) Date of Patent: Sep. 6, 2005

(54) DOUBLE GATE FIELD EFFECT TRANSISTOR WITH DIAMOND FILM

(75) Inventor: Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 128 days.

(21) Appl. No.: 10/135,423

(22) Filed: Apr. 30, 2002

(65) Prior Publication Data

US 2003/0201492 A1 Oct. 30, 2003

(51) Int. Cl.[7] .......... H01L 31/0312

(52) U.S. Cl. .......... 257/69; 257/365; 257/77; 257/288; 257/613

(58) Field of Search .......... 438/105, 158, 438/149–166, 592, 459, 977, FOR 105, FOR 193, FOR 477, FOR 246; 257/22, 51, 66, 77, 266, 613, 69, 365

(56) References Cited

U.S. PATENT DOCUMENTS

| | | | | | |
|---|---|---|---|---|---|
| 5,276,338 | A | * | 1/1994 | Beyer et al. | 257/52 |
| 6,171,982 | B1 | * | 1/2001 | Sato | 438/795 |
| 6,582,513 | B1 | * | 6/2003 | Linares et al. | 117/93 |
| 2002/0164107 | A1 | * | 11/2002 | Boudreau et al. | 385/14 |
| 2003/0080688 | A1 | * | 5/2003 | Eden et al. | 315/169.3 |
| 2003/0203615 | A1 | * | 10/2003 | Denning et al. | 438/627 |

* cited by examiner

*Primary Examiner*—George Fourson
*Assistant Examiner*—Thanh V. Pham
(74) *Attorney, Agent, or Firm*—Trop, Pruner & Hu, P.C.

(57) ABSTRACT

A double gate silicon over insulator transistor may be formed wherein the bottom gate electrode is formed of a doped diamond film. The doped diamond film may be formed in the process of semiconductor manufacture resulting in an embedded electrode. The diamond film may be advantageous as a heat spreader.

15 Claims, 3 Drawing Sheets

DOUBLE GATE FIELD EFFECT TRANSISTOR WITH DIAMOND FILM

BACKGROUND

This invention relates generally to double gate silicon on insulator semiconductor integrated circuits.

As silicon approaches its scaling limits, double gate field effect transistors are attractive ways to achieve smaller gate lengths for the same oxide thicknesses. Double gate silicon over insulator structures are considered to be the most scalable technology down to an 0.02 micron regime. Such devices can have higher gain than conventional single gate transistors.

However, the fabrication of double gate transistors generally involves complex processing and/or the use of polycrystalline silicon thin films for the device layers sandwiched between the two gates. Since the polycrystalline film is not a single crystal, the electronic quality may be degraded compared to structures using single crystal material.

Thus, there is a need for less complex ways of producing greatly scaled transistors having adequate electronic qualities.

DETAILED DESCRIPTION

Figure 1:
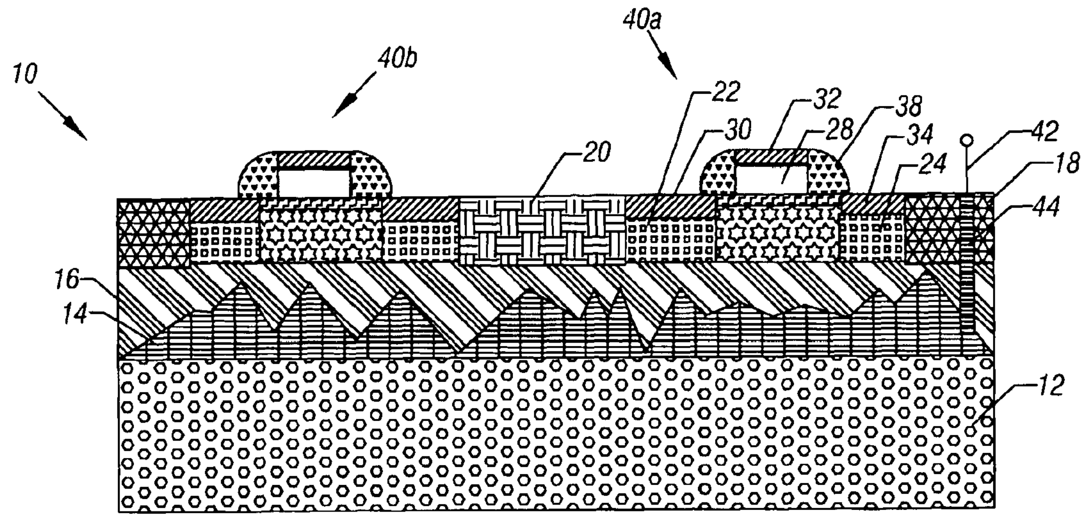
FIG. 1 is a greatly enlarged cross-sectional view of one embodiment of the present invention.

Referring to FIG. 1, in accordance with one embodiment of the present invention, a complementary metal oxide semiconductor (CMOS) integrated circuit 10 may include a PMOS transistor 40*a* and an NMOS transistor 40*b*. The transistors 40*a* and 40*b* may be isolated by a shallow trench isolation (STI) 20 in accordance with one embodiment of the present invention. The transistors 40*a* and 40*b* may be formed in a semiconductor over insulator (SOI) single crystal film 18 in one embodiment of the present invention. The film 18 may be bonded to a dielectric layer 16 that may be an oxide. The layer 16 is in turn positioned over a doped diamond film 14 and a semiconductor structure 12. The structure 12 may be a silicon substrate in one embodiment of the present invention or, as another example, a polycrystalline material.

Each transistor 40 includes a contact 32, a gate electrode 28, sidewall spacers 38, source and drain contacts 30 and 34, and sources and drains 24 and 22, in accordance with one embodiment of the present invention. A potential 42 may be supplied through a via 44 to the doped diamond film 14 that acts as the bottom gate electrode of each double gate transistor 40. Bias potentials may also be applied through contacts 32 to the gate electrodes 28.

In one embodiment of the present invention each transistor 40 may be fully depleted. The doped diamond film 14 not only functions as the bottom electrode of a double gate transistor structure but also acts as an excellent heat spreader beneath the integrated circuit 10 to deal with thermal issues.

The dielectric layer 16 on the diamond film 14 functions as part of the bottom gate. A field effect transistor is fabricated in a single crystalline layer 18 bonded to the layer 16 with a top gate electrode 28 on the surface of the single crystal film 18.

With this arrangement, the bottom gate dielectric layer 16 and film 14 are built into the wafer prior to wafer processing operations for device and circuit manufacture. The fabrication of dual gate metal oxide semiconductor field effect transistors 40 is done in a similar manner to current methods of manufacturing conventional single gate devices but utilizing fully depleted transistors 40.

The conductivity of the diamond film 14 can be varied over several orders of magnitude by doping with boron, for example. N-type doping can be achieved by doping with nitrogen. The diamond film 14, with exceptional thermal conductivity, also functions as a heat spreader which may have important implications for handling increasingly high thermal loads in high performance logic devices such as processors.

Figure 2:
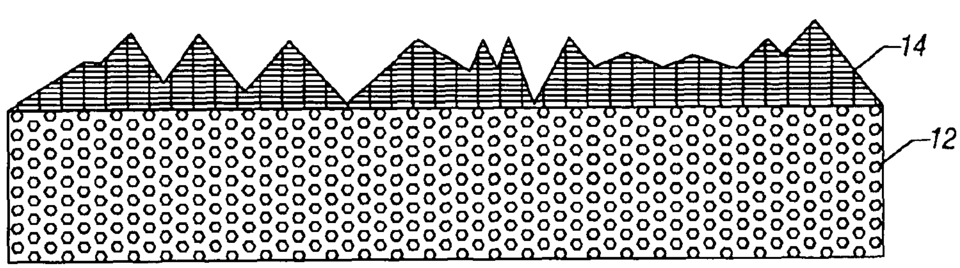
FIG. 2 is a greatly enlarged cross-sectional view of the embodiment as shown in FIG. 1 at an early stage of manufacturing according to one embodiment of the present invention.

Referring to FIG. 2, the diamond film 14 may be formed on a semiconductor structure 12 in accordance with one embodiment of the present invention. The diamond film 14 may have a thickness ranging from 10 to 50 microns and may be deposited on a silicon wafer acting as the structure 12 in one embodiment of the present invention. The film 14 may be formed of a doped material or may be doped after deposition by ion implantation, for example.

Figure 3:
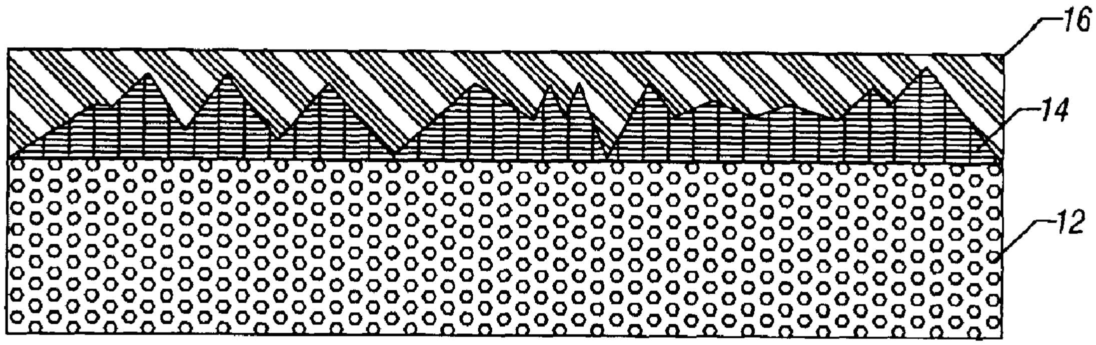
FIG. 3 is a greatly enlarged cross-sectional view of the embodiment as shown in FIG. 2 at a subsequent stage of manufacturing in one embodiment of the present invention.

As shown in FIG. 3, a thin film of silicon dioxide or other dielectric layer 16 may be deposited or otherwise formed on the diamond film 14. In one embodiment, silicon dioxide films may have a thickness of 1 to 5 microns. Thereafter, the layer 16 may be polished.

Figure 4:
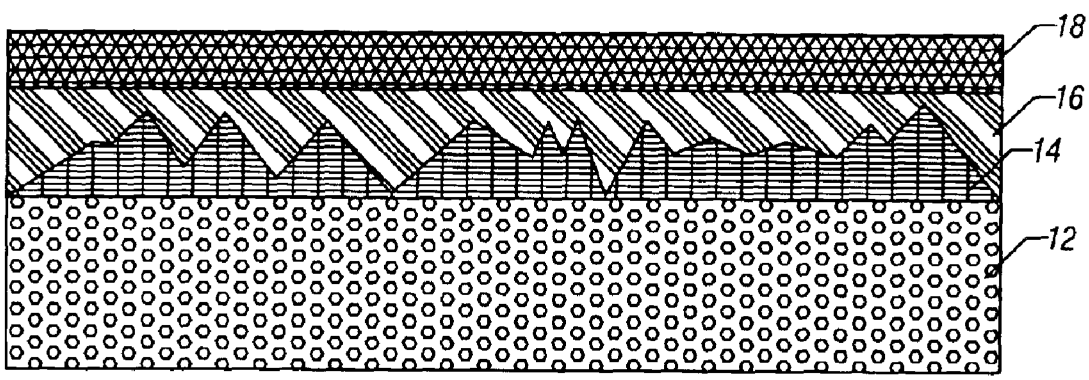
FIG. 4 is a greatly enlarged cross-sectional view of the embodiment as shown in FIG. 3 at a subsequent stage of manufacturing in accordance with one embodiment of the present invention.

As shown in FIG. 4, a high quality single crystal film 18 may be bonded to the dielectric layer 16 in one embodiment. The bonding of the film 18 to the dielectric layer 16 may be achieved by various methods including thermally bonding a thick single crystal silicon and polishing it back to the desired device thickness. As another example, a top single crystal silicon layer may be bonded by a layer transfer process whereby hydrogen is implanted into a single crystalline silicon wafer. The implanted side is then bonded to the silicon dioxide on diamond. This removes a major portion of the top silicon layer by cleaving at the hydrogen implanted region.

Thus, the doped diamond film 14, which acts as the bottom gate electrode, may be embedded within the wafer during the wafer manufacturing process. This may simplify fabrication of the dual gate structures. In addition, the use of doped diamond films achieves high thermal conductivity and thermally stable electrodes for biasing gates.

Figure 5:
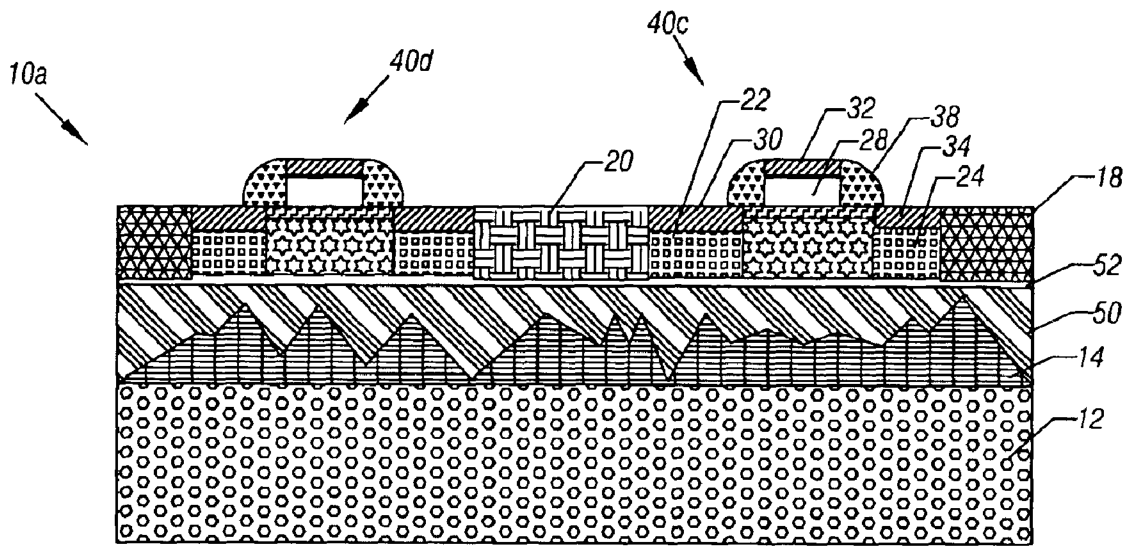
FIG. 5 is a greatly enlarged cross-sectional view of another embodiment of the present invention.

Referring to FIG. 5, the integrated circuit 10*a* may include complementary metal oxide semiconductor transistors 40, including a PMOS transistor 40*c* and an NMOS transistor 40*d*, in accordance with one embodiment of the present invention. Those transistors may be formed in a single crystal film 18 in accordance with one embodiment of the present invention. Below the film 18 is an oxide layer 52. Underlying the oxide layer 52 is a doped polysilicon film 50. The doped polysilicon film 50 may be deposited on a diamond film 14. In this embodiment, the doped polysilicon film 50 functions as the bottom electrode and the diamond film 14 acts as a heat spreader and need not function as a gate electrode. In such case, the diamond film 14 need not be doped.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An integrated circuit comprising:

a semiconductor structure;

a doped diamond film over said structure;

a dielectric over said doped diamond film;

a single crystalline film over said dielectric; and a transistor having a first gate, said transistor having a source and drain in said single crystalline film, said diamond film to act as a second gate.

2. The circuit of claim 1 wherein said single crystalline film is silicon over insulator.

3. The circuit of claim 1 further including a contact that contacts said diamond film and extends through said dielectric and said single crystalline film.

4. The circuit of claim 3 wherein said contact is a metal via.

5. The circuit of claim 1 wherein said dielectric is oxide.

6. The circuit of claim 1 further including complementary metal oxide semiconductor transistors formed in said single crystalline film.

7. The circuit of claim 6 including NMOS and PMOS transistors separated by a trench isolation.

8. An integrated circuit comprising:

a semiconductor structure;

a second gate including a diamond film over said structure;

a dielectric over said diamond film;

a single crystalline film over said dielectric; and a transistor including a first gate formed over said film and a source and drain formed in said single crystalline film.

9. The circuit of claim 8 wherein said diamond film is doped.

10. The circuit of claim 8 wherein said single crystalline film is silicon over insulator.

11. The circuit of claim 8 further including a contact that contacts said second gate and extends through said dielectric and the single crystalline film.

12. The circuit of claim 11 wherein said contact is a metal via.

13. The circuit of claim 8 wherein said dielectric is oxide.

14. The circuit of claim 8 further including complementary metal oxide semiconductor transistors formed in said single crystal film.

15. The circuit of claim 14 further including a trench isolation separating NMOS and PMOS transistors.

* * * * *